United States Patent
Murugan et al.

(10) Patent No.: US 7,251,302 B2
(45) Date of Patent: Jul. 31, 2007

(54) METHOD, SYSTEM AND APPARATUS FOR QUANTIFYING THE CONTRIBUTION OF INTER-SYMBOL INTERFERENCE JITTER ON TIMING SKEW BUDGET

(75) Inventors: Rajen Murugan, Round Rock, TX (US); Michael Greim, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 726 days.

(21) Appl. No.: 10/729,625

(22) Filed: Dec. 5, 2003

(65) Prior Publication Data

US 2005/0125175 A1    Jun. 9, 2005

(51) Int. Cl.
*H03D 1/04* (2006.01)
(52) U.S. Cl. .................. 375/346; 375/348
(58) Field of Classification Search ............ 375/346, 375/348, 284, 286, 278
See application file for complete search history.

(56) References Cited

U.S. PATENT DOCUMENTS

| | | | |
|---|---|---|---|
| 5,600,502 A | 2/1997 | Fisher | 360/51 |
| 5,825,521 A | 10/1998 | Ogawa et al. | 359/161 |
| 5,841,601 A | 11/1998 | Fisher | 360/48 |
| 6,012,161 A * | 1/2000 | Ariyavisitakul et al. | 714/795 |
| 6,094,408 A | 7/2000 | Verboom | 369/59 |
| 6,347,127 B1 | 2/2002 | Chen | 375/348 |
| 6,353,343 B1 | 3/2002 | Payne et al. | 327/52 |
| 7,151,796 B2 * | 12/2006 | Allpress et al. | 375/229 |
| 2003/0048852 A1 | 3/2003 | Hwang et al. | 375/240.26 |
| 2003/0067642 A1 | 4/2003 | Svenson et al. | 359/111 |
| 2003/0161422 A1 | 8/2003 | Bi | 375/348 |
| 2006/0034363 A1 * | 2/2006 | Wang et al. | 375/233 |

FOREIGN PATENT DOCUMENTS

| | | |
|---|---|---|
| EP | 0 727 890 A2 | 8/1996 |
| WO | 03/024067 A1 | 3/2003 |
| WO | 03/036893 A1 | 5/2003 |

* cited by examiner

*Primary Examiner*—Emmanuel Bayard
(74) *Attorney, Agent, or Firm*—Baker Botts L.L.P.

(57) ABSTRACT

An apparatus, method and system are provided for quantifying communication channel intersymbol interference jitter effect contribution to timing skew. In general, lossy and lossless characteristics of the communication channel are preferably obtained and an output signal of the communication channel is sampled. From the sampled output signal and the lossy characteristics of the communication channel, an input signal may be derived. Using the lossless characteristics of the communication channel, the derived input signal and the sampled output signal, a value indicating the contribution of intersymbol interference jitter effect on timing skew budget for a selection communication channel may be obtained.

21 Claims, 2 Drawing Sheets

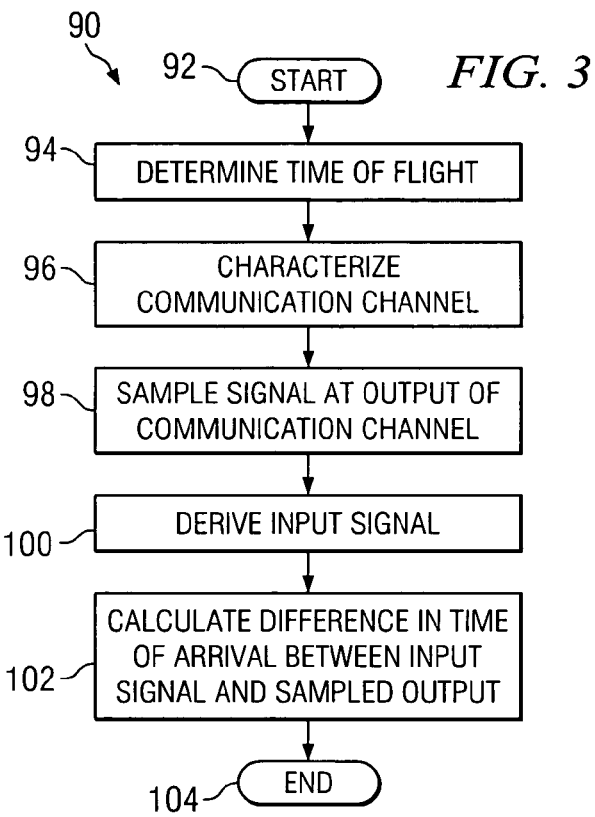
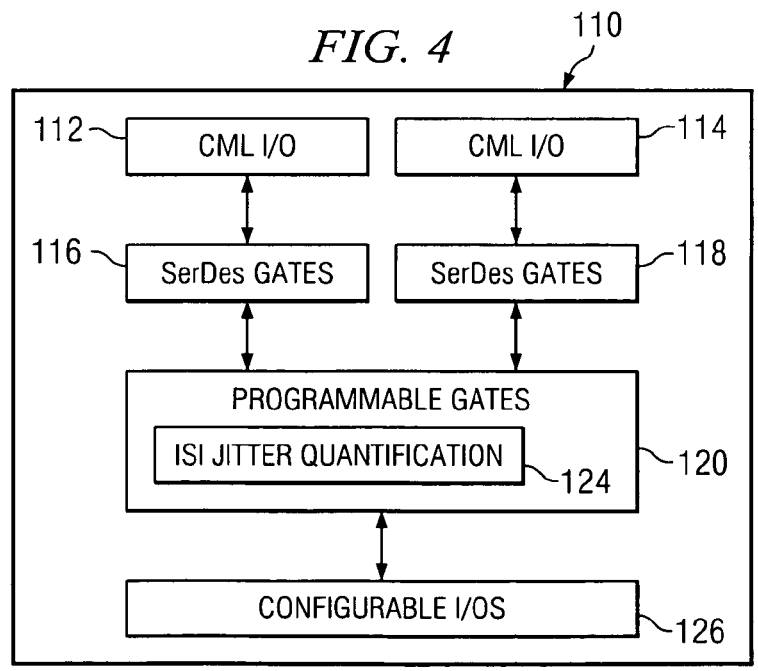

METHOD, SYSTEM AND APPARATUS FOR QUANTIFYING THE CONTRIBUTION OF INTER-SYMBOL INTERFERENCE JITTER ON TIMING SKEW BUDGET

TECHNICAL FIELD

The present disclosure relates generally to information handling systems and, more particularly, to a method, system and apparatus for resolving timing issues in high speed information handling system designs.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

In one area of information handling systems manufactured today, shrinking geometries and higher clock speeds combined with the escalating costs of respins have promoted signal integrity to the forefront of a key issue on the tool development agenda for the Electronic Design Automation, (EDA) industry. With the present focus on understanding and mitigating the analog effects of signals through comprehensive signal integrity characterization, little if any effort is being spent by EDA vendors on addressing the evolving digital side of information handling system design.

The signal integrity issue is particularly relevant in high speed timing analysis, both at the chip and board level. Taking into consideration the speed at which modern day information handling systems operate, designers can no longer rely on traditional "rules of thumb" for high speed design. In light of such issues as circuit timing problems and timing violations, more formal methods are needed to ensure reliable design operation at intended speeds and under all conditions.

SUMMARY

In accordance with teachings of the present disclosure, a method for quantifying a communication channel inter-symbol interference (ISI) jitter effect contribution to timing skew is provided. The method preferably includes deriving an input signal to the communication channel using a communication channel impulse response function and a sampled output signal. The method preferably further includes calculating a difference between the derived input signal based on a substantially lossless communication channel propagation delay and the sampled output signal based on a substantially lossy communication channel to identify the ISI jitter effect contribution to timing skew.

Further, in accordance with teachings of the present disclosure, an apparatus for quantifying inter-symbol interference (ISI) jitter contribution to communication link timing skew is provided. The apparatus preferably includes a transmitter operable to communicate at least one signal on the communication link, a receiver operably coupled to the transmitter, the receiver operable to receive a signal from the communication link and a plurality of gates operably coupled to the receiver and the transmitter. The plurality of gates is preferably operable to identify characteristics of the communication link under substantially lossless conditions and under lossy conditions. The plurality of gates is preferably further operable to identify an input signal from the lossy characteristics of the communication link and a sampled output signal. In addition, the plurality of gates is preferably operable to compare the input signal based on the characteristics of the communication link under substantially lossless conditions and the sampled output signal to quantify the ISI jitter contribution to communication link timing skew.

In another aspect, teachings of the present disclosure provide an information handling system including at least one processor, memory operably coupled to the processor and a module operably associated with the memory and the processor. The module is preferably operable to derive an input signal from a sampled output signal and lossyness characteristics of a communication channel. The module is preferably further operable to determine a timing offset between the derived input and the sampled output signal, the offset representing an intersymbol interference jitter effect contribution to a communication channel timing skew budget.

In one aspect, teachings of the present disclosure provide the advantage of quantifying intersymbol interference jitter effect on timing skew budget.

In another aspect, teachings of the present disclosure provide the advantages of improving on-board level timing analysis to ensure first pass design success and time to market.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 3 is a flow diagram depicting one embodiment of a methodology for quantifying intersymbol interference jitter according to teachings of the present disclosure; and FIG. 4 is a block diagram illustrating one embodiment of an apparatus incorporating teachings of the present disclosure.

DETAILED DESCRIPTION

Preferred embodiments and their advantages are best understood by reference to FIGS. 1 through 4, wherein like numbers are used to indicate like and corresponding parts.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
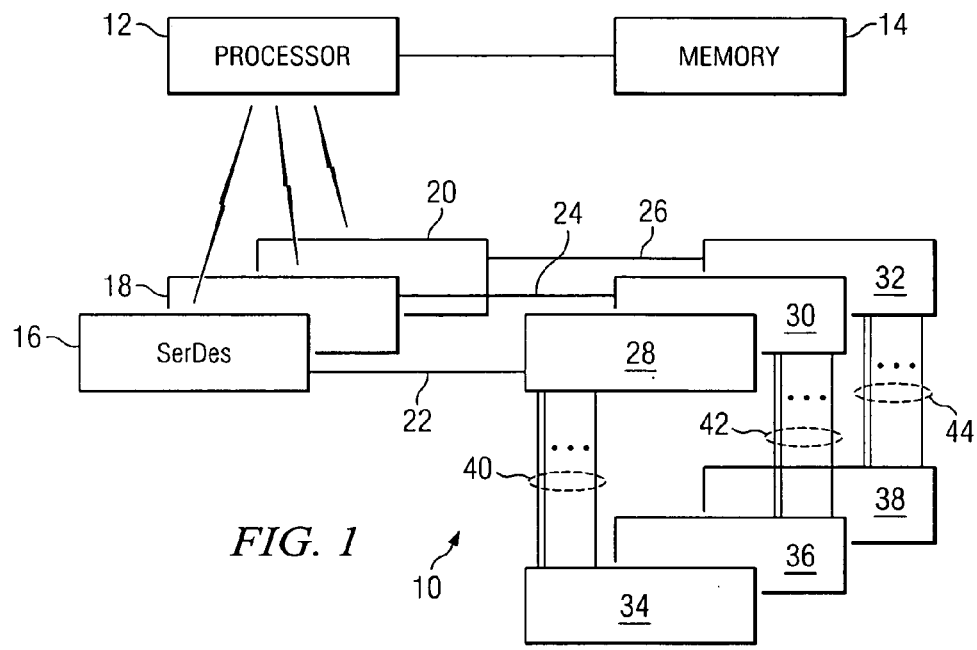
FIG. 1 is a block diagram illustrating one embodiment of an information handling system incorporating teachings of the present disclosure.

Referring first to FIG. 1, a block diagram of an information handling system incorporating teachings of the present disclosure is shown generally at 10. In one embodiment, information handling system 10 may be implemented as a server. Additional embodiments of information handling systems which may incorporate teachings of the present disclosure include, but are not limited to, routers, switches, storage area network (SAN) equipment, multiplexers, optical crossconnects, network aggregators, wide area network (WAN) access concentrators, server clusters and high speed automated test equipment.

As shown in FIG. 1, information handling system 10 preferably includes at least one processor 12. Operably coupled to processor 12 are one or more memory devices 14. Additional components may be included in information handling system 10, coupling processor 12 to memory 14 such as one or more memory controllers (note expressly shown), one or more data busses (not expressly shown), as well as other components.

Also preferably included in information handling system 10 are one or more serializer/deserializers (SERDES) 16, 18 and 20. In one embodiment, one or more SERDES 16, 18 and 20 preferably included in information handling system 10 may be quad, high speed, full duplex SERDES transceivers. According to teachings of the present disclosure, one or more SERDES 16, 18 and 20 may form a data interface that can be used to transmit parallel data between chips, across a system board, through a backplane, through cabling or other connections, as well as along other communication channels or links. Also in a preferred embodiment, one or more SERDES 16, 18 and 20 may be used for point-to-point data transfer operations in high speed data networking applications.

In general, one or more SERDES 16, 18 and 20 devices may be used to provide a high speed bus without numerous connections on a backplane or cables between chassis. As such, one preferred application for SERDES transceivers 16, 18 and 20 may be where it is desirable to eliminate numerous interconnections while maintaining high data throughput. As a result, one or more SERDES transceivers 16, 18 and 20 may be used in high speed serial backplane interconnect applications, Fibre Channel, Infiniband, Gigabit Ethernet, Ten Gigabit Ethernet, serial ATA line interfaces as well as chassis-to-chassis serial connections.

As illustrated in FIG. 1, SERDES 16, 18 and 20 are preferably operably coupled via communication channels or links 22, 24 and 26, to components 28, 30 and 32, respectively. As suggested above, devices 28, 30 and 32 may assume a variety of forms. For example, devices 28, 30 and 32 may be implemented as, without limitation, SERDES, separate information handling systems or chassis, routers, switches and/or server clusters.

Communication channels 22, 24 and 26, depending on the specific implementation of information handling system 10, may either be serial communication channels or multi-bit communication channels. In operation, one or more SERDES included in information handling system 10, such as SERDES 16, 18 and 20, are preferably operable to receive parallel or multi-bit data and serialize parallel or multi-bit data into a serial bit stream for transmission. When acting as a deserializer, a SERDES of information handling system 10, such as SERDES 16, 18 and 20, is preferably operable to receive serial data, decode it and convert it back to a parallel or multi-bit data interface along with a recovered data clock.

In one embodiment of information handling system 10, SERDES 16, 18 and 20 may be coupled to one or more SERDES 28, 30 and 32 via communication channels 22, 24 and 26, respectively. In such an embodiment, SERDES 16, 18 and 20 are preferably operable to receive multi-bit signals, serialize the multi-bit signals, and transmit the serialized signals via communication channels 22, 24 and 26, respectively, to SERDES 28, 30 and 32. SERDES 28, 30 and 32, in such an embodiment, are preferably operable to receive the serial data from SERDES 16, 18 and 20 via communication channels 22, 24 and 26, respectively, decode the serial data and convert it back to a parallel or multibit data interface along with a recovered data clock. The deserialized or multi-bit data communication created by SERDES 28, 30 and 32, in such an embodiment, may subsequently be passed to devices or components 34, 36 and 38 via communication channels 40, 42 and 44 respectively.

Likewise, in such an embodiment, SERDES 28, 30 and 32 may be operable to receive a multi-bit signal from devices or components 34, 36 and 38 via communication channels or signal paths 40, 42 and 44, respectively. Upon receipt of multi-bit signals, SERDES 28, 30 and 32 are preferably operable to convert or serialize the multi-bit data signals into a serial bit stream. Following serialization of the multi-bit data streams, SERDES 28, 30 and 32 may then communicate the serialized bit stream to SERDES 16, 18 and 20 via communication channels 22, 24 and 26, respectively. SERDES 16, 18 and 20 may then deserialize the serial bitstream received via communication paths 22, 24 and 26, respectively, and communicate the deserialized or multi-bit data stream to processor 12, memory 14 or other component of information handling system 10.

In general, the serialization and deserialization of multi-bit or serial data streams, respectively, as well as the communication of serial data streams, are typically performed at relatively high speeds. As a consequence, the timing of operations performed by components of information handling system 10, such as SERDES 16, 18 and 20, SERDES or components 28, 30 and 32, etc., is of significant concern. To properly time the components of information handling system 10, the timing skew of a communication channel must be taken into consideration.

In general, timing skew may be defined as the uncertainty in the arrival of a signal edge. Timing skew is typically influenced by the effects of crosstalk, simultaneous switching noise, data and clock jitter, also known as intersymbol interference (ISI), and electromagnetic interference, as well as other factors. As a consequence, accurate methods of identifying and quantifying influences on timing skew are needed. A representative depiction of intersymbol interference is shown generally in FIG. 2.

Figure 2:
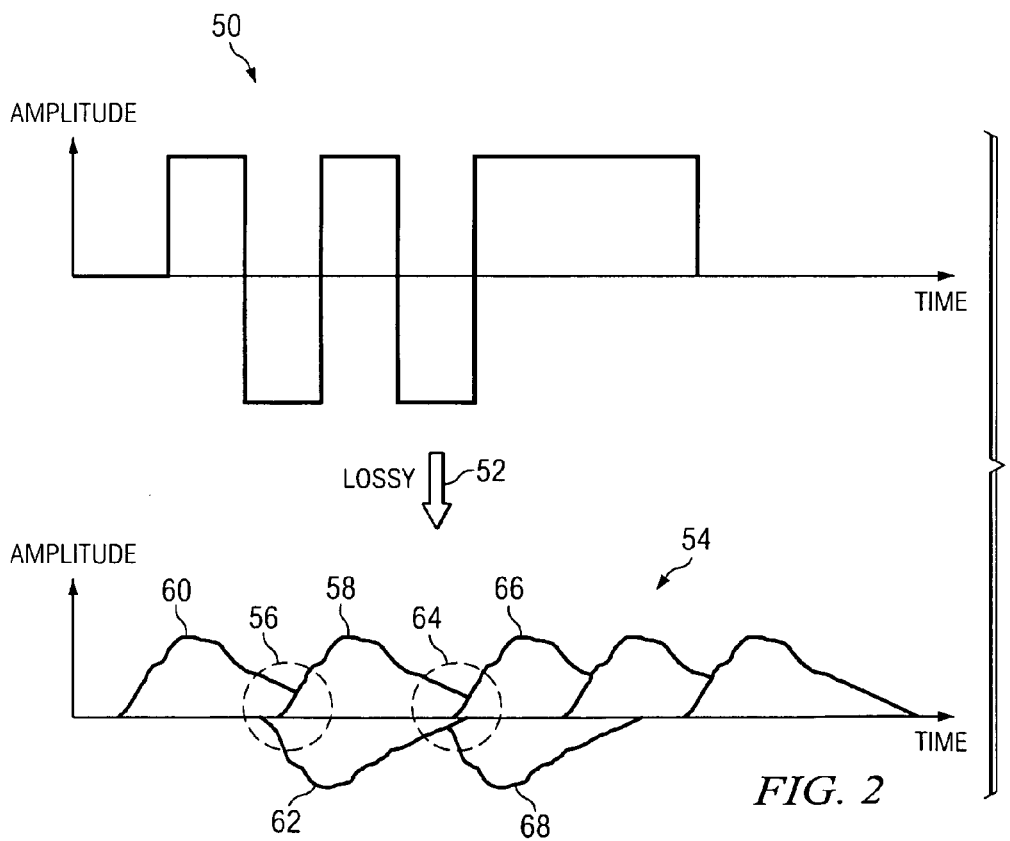
FIG. 2 illustrates a timing diagram depicting effects of lossy communication channel attenuation and distortion on an input signal according to teachings of the present disclosure.

Referring now to FIG. 2, one representation of the intersymbol interference resulting from transmission of an input sequence into a lossy communication channel, link or interconnect is shown. An ideal representation of an input sequence is shown generally at 50 in FIG. 2. As illustrated in FIG. 2, input sequence "1010111" passed through a typical, lossy communication channel, link or interconnect 52 generally results in the signal sequence illustrated at 54. Highlighted portion 56 of signal pattern 54 shows intersymbol interference in third symbol 58 from first and second signal transmissions 60 and 62, respectively. Likewise, at 64 intersymbol interference into fifth symbol 66 from third and fourth symbols 58 and 68, respectively, is shown.

As illustrated in FIG. 2, lossy transmission medium 52, such as a communication channel/interconnect/link, tends to create a tail of energy that typically lasts longer than intended. As a result, energy from one or more symbols is often "smeared" into later symbols, thereby interfering with one or more of the subsequent symbols.

Referring now to FIG. 3, a flow diagram depicting one embodiment of a method for quantifying the contribution of intersymbol interference (ISI) jitter effect on timing skew budget is shown according to teachings of the present disclosure. The method for quantifying the contribution of intersymbol interference jitter effect on timing skew budget illustrated generally at 90 in FIG. 3 may be implemented in a variety of manners. For example, method 90 may be implemented as a program of instructions and utilized in simulation or test equipment by SERDES designers or vendors. In an alternate embodiment, method 90 may be implemented in silicon, using a plurality of gates, such as using integrated circuits, application specific integrated circuits, serializer/deserializers DSP circuits, as well as other microchip components.

Upon beginning at 92, method 90 preferably proceeds to 94 where a time of flight for a selected communication channel may be determined. In general, time of flight of a communication channel may be defined as the time it takes a signal to propagate (i.e., propagation delay) from an input point of the communication channel to the output end of the communication channel, under substantially lossless conditions.

According to teachings of the present disclosure, a communication channel's time of flight (TOF) may be determined or calculated using a variety of methods. In one embodiment, communication channel TOF may be calculated by solving Equation One below:

$$TOF = d\sqrt{lc} \quad \text{Equation One (1)}$$

where d is the length of the communication channel in unit length measurements, and l and c are the inductance and capacitance, respectively, per unit length of the communication channel. Values for d, l and c, in one embodiment, may be obtained by reading a registry of one or more SERDES or other information handling system components storing such information and associated with a selected communication channel. The reading of a SERDES registry may be achieved via the use of an $I^2C$ (Inter-Integrated Circuit) port or a JTAG (Joint Test Action Group) port, e.g., an IEEE 1149.1 JTAG test port.

In an alternate embodiment, communication channel TOF may be determined or calculated by sending a training pattern, via idle insertion/deletion, at low repetitive frequency across the channel and measuring the difference between the send time and the receive time of the training patterns. In such an implementation, the style of training pattern selected is preferably one determined to propagate along the communication channel and to effectively simulate a substantially lossless channel e.g., a training pattern with a slow rising edge, low frequency, etc.

Once a Time of Flight for each selected communication channel has been determined or calculated at 94, method 90 preferably proceeds to 96 where the selected communication channels may be characterized according to their lossyness characteristics or traits. In one aspect, characterizing the lossyness of a communication channel involves calculating an impulse response of the channel, in the time domain. One method for calculating the impulse response of a communication channel, in the time domain, is by applying an impulse input function, such as a Dirac impulse input function, to the communication channel and measuring the signal produced at the output of the communication channel. The output of a communication channel receiving an impulse input function generally defines or characterizes the communication channel's lossy characteristics.

According to teachings of the present disclosure, determining communication channel TOF at 94 may be implemented or effected at power up of an information handling system, as a feature of the information handling system chipset or in one or more information handling system SERDES. In addition, characterizing communication channel lossyness may also be effected or implemented at power up of an information handling system and as a feature of the information handling system chipset or SERDES. Alterations to the timing of TOF calculations and lossyness characterization of a communication channel, at 94 and 96 respectively, may be implemented without departing from the spirit and scope of teachings of the present disclosure.

Once an impulse response function of a communication channel is known, method 90 preferably proceeds to 98. At 98, a signal sample is preferably taken at an output of the communication channel, e.g., at a second receiving SERDES connected to a first, transmitting SERDES. In one embodiment, the signal produced and sampled at the output of the communication channel is preferably that generated by an operating or operational input signal, e.g., a signal produced in accordance with a functioning or operational information handling system performing normal processing operations.

Having calculated the impulse response of the communication channel at 96 and obtained a measured or sampled output signal at 98, method 90 preferably proceeds to 100. At 100, a driver buffer input or the input signal to a given communication channel may be derived using the impulse response function obtained at 96 and the sampled or recovered output function obtained at 98. The input signal for a given communication channel may be derived or calculated at 100 by solving Equation Two below:

$$y(t) = x(t) * h(t) = \int_{-\infty}^{+\infty} x(\tau) \cdot h(t-\tau) d\tau \quad \text{Equation Two (2)}$$

for x(t), where y(t) is the sampled or measured output signal of the communication channel obtained at 98 and h(t) is the impulse response function of the communication channel as obtained at 96.

Solution of the convolution integral in Equation Two to derive a communication channel input signal, or x(t), may be implemented by configuring one or more pluralities of gates on a SERDES incorporated into an information handling system, for example. Alternative implementations for performing operations associated with teachings of the present disclosure are contemplated.

After deriving the input signal for a given communication channel at 100, method 90 preferably proceeds to 102. At 102, the difference in time of arrival between the input signal and the sampled output signal is preferably calculated or determined.

At 102, ISI jitter effect on timing skew budget may be obtained using the input signal x(t) derived at 100, the communication channel TOF obtained at 94 and the output signal y(t) sampled at 98. Using the waveform x(t) for the derived input signal and a t value equal to communication channel TOF, x(TOF) may be subtracted from the sampled output signal y(t) to arrive at a value for communication channel ISI jitter effect on timing skew budget. In other words, x(TOF) identifies a point in time when x(t) would reach its destination, or the output of the communication channel, under substantially lossless conditions. As y(t) is known to arrive later than x(TOF), the difference between x(TOF) and y(t) as sampled at the output of the communication channel is said to characterize ISI jitter as a result of lossy communication channel characteristics. Hence, the difference is the quantification of ISI jitter effect to be taken into account with respect to signal timing, timing skew budget, etc., for the associated communication channel.

According to teachings of the present disclosure, the time value of interest at 102 may be computed by subtracting the sampled output function y(t) from the derived input function x(t) at the midpoint voltage of the signals. The midpoint voltage of the signals may be defined as in Equation Three below:

$$V_{MPT} = \frac{V_{OH} - V_{OL}}{2} \qquad \text{Equation Three (3)}$$

where $V_{OH}$ and $V_{OL}$ are DC (direct current) high output voltage and low output voltage, respectively. Following calculation of ISI jitter effect on timing skew budget at 102, method 90 preferably ends at 104.

Having isolated and quantified a value for timing skew due to intersymbol interference, more accurate timing analysis may be achieved in signaling planning, information handling system design, as well as in many other aspects of advanced computer engineering. According to teachings of the present disclosure, method 90 and teachings herein may be employed to address crucial and recurrent limitations in existing methodologies for appropriately characterizing intersymbol interference jitter, either in the time or frequency domain, as a crucial component which contributes significantly to timing skew.

As mentioned above, operations at 94 and 96 may be implemented at power up of an information handling system or an information handling system chipset, as well as otherwise. The operations performed at 98 through 104, alternatively, may be implemented as a post-processing or post power up feature once the function y(t) has been sampled. In an embodiment, the operations performed at 98, 100 and 102 may be implemented using one or more SERDES, built-in digital signal processing circuits, integrated circuits, application-specific integrated circuits, as well as in other microchip implementations.

Referring now to FIG. 4, one embodiment of a serializer/deserializer incorporating teachings of the present disclosure is shown. As mentioned above, alternatives to implementing teachings of the present disclosure in SERDES 110 include, but are not limited to, integrated circuits, application-specific integrated circuits, digital signal processors, simulation software or hardware, automated or non-automated test equipment, as well as numerous other implementations.

As illustrated in FIG. 4, SERDES 110 may include a plurality of logical blocks. In general, SERDES 110 may include one or more input/output (I/O) ports 112 and 114. In the embodiment of SERDES 110 illustrated in FIG. 4, I/O ports 112 and 114 may be implemented as common mode logic (CML) ports.

In addition to CML I/O ports 112 and 114, SERDES 110 preferably also includes one or more pluralities of gates cooperating to perform at least SERDES specific functions. As illustrated in FIG. 4, SERDES gate pluralities 116 and 118 are preferably coupled to common mode logic I/O ports 112 and 114, respectively. In one embodiment, SERDES gate pluralities 116 and 118 may perform serializing and deserializing operations for communication channels or links operably coupled to CML I/O ports 112 and 114, respectively.

According to teachings of the present disclosure, SERDES 110 may also include a plurality of programmable gates 120. In a preferred embodiment, programmable gates 120 may be configured and arranged such that one or more gates cooperates to perform one or more user desired operations. According to teachings of the present disclosure, a plurality of programmable gates 20 may cooperate or be arranged to create ISI jitter quantification capabilities 124. In view of teachings of the present disclosure, ISI jitter quantification capabilities 124 may implement method 90 of FIG. 3, or a derivation thereof. In an alternate embodiment, multiple SERDES 110 or substantial equivalents may be coupled to a plurality of communication channels included in a particular information handling system design and wherein the multiple SERDES 110 cooperate to perform substantially in accordance with method 90 to quantify intersymbol interference jitter effect on timing skew for one or more of the various communication channels.

Operably coupled to programmable gates 120 are one or more configurable I/O ports 126. Not expressly shown in SERDES 110 of FIG. 4 are one or more JTAG ports operably coupled to programmable gate plurality 120. As mentioned above, a JTAG port or $I^2C$ port may be employed to ascertain properties of a communication channel such that a communication channel TOF may be calculated instead of or in addition to being measured as well as for other purposes. Additional components and or subcomponents may be incorporated in SERDES 110 of FIG. 4 without departing from the spirit and scope of teachings of the present disclosure.

Although the disclosed embodiments have been described in detail, it should be understood that various changes, substitutions and alterations can be made to the embodiments without departing from their spirit and scope.

What is claimed is:

1. A method for quantifying a communication channel inter-symbol interference (ISI) jitter effect contribution to timing skew, comprising:

deriving an input signal to the communication channel using a communication channel impulse response function and a sampled output signal; and calculating a difference between the derived input signal based on a substantially lossless communication channel propagation delay and the sampled output signal to identify the ISI jitter effect contribution to timing skew.

2. The method of claim 1, further comprising sending a low frequency training pattern along the communication channel via idle insertion/deletion to calculate the substantially lossless communication channel propagation delay.

3. The method of claim 1, further comprising calculating the substantially lossless communication channel propagation delay from measured physical and electrical characteristics of the communication channel.

4. The method of claim 1, further comprising applying a DIRAC impulse input function to the communication channel to calculate the impulse response function.

5. The method of claim 1, further comprising deriving the input signal to the communication channel by solving a convolution integral $$y(t) = x(t) * h(t) = \int_{-\infty}^{\infty} x(\tau) \cdot h(t-\tau) d\tau$$

for x(t), where y(t) equals the sampled output and h(t) equals the communication channel impulse response function.

6. The method of claim 1, further comprising calculating the difference between the derived input signal based on the substantially lossless communication channel propagation delay and the sampled output signal as measured at a midpoint voltage for each signal to identify the ISI jitter effect contribution to timing skew.

7. An apparatus for quantifying inter-symbol interference (ISI) jitter contribution to communication link timing skew, comprising:

a transmitter operable to communicate at least one signal on the communication link;

a receiver operably coupled to the transmitter, the receiver operable to receive a signal from the communication link; and a plurality of gates operably coupled to the receiver and the transmitter, the plurality of gates operable to identify characteristics of the communication link under substantially lossless conditions, identify characteristics of the communication link under lossy conditions, identify an input signal from the lossy characteristics of the communication link and a sampled output signal, and compare the input signal based on the characteristics of the communication link under substantially lossless conditions and the sampled output signal to quantify the ISI jitter contribution to communication link timing skew.

8. The apparatus of claim 7, further comprising the plurality of gates operable to serialize a multi-bit signal.

9. The apparatus of claim 7, further comprising the plurality of gates operable to convert a serialized multi-bit signal into a multi-bit signal.

10. The apparatus of claim 7, further comprising the plurality of gates operable to identify the lossy characteristics of the communications link by calculating an impulse response function for the communication link using a DIRAC impulse input signal.

11. The apparatus of claim 7, further comprising the plurality of gates operable to derive the input signal to the communication link from a convolution integral $$y(t) = x(t) * h(t) = \int_{-\infty}^{\infty} x(\tau) \cdot h(t-\tau) d\tau$$

where h(t) equals the lossy characteristics of the communication link and y(t) equals the sampled output signal.

12. The apparatus of claim 7, further comprising the plurality of gates operable to determine characteristics of the communication link under substantially lossless conditions by calculating a propagation delay for a low frequency training pattern introduced via idle insertion/deletion to the communications link.

13. The apparatus of claim 7, further comprising the plurality of gates operable to calculate a time of flight for the communication link using measures representative of communication link length, capacitance and inductance.

14. The apparatus of claim 13, further comprising the plurality of gates operable to obtain the measures for communication link length, capacitance and inductance from a registry associated with the communication link.

15. An information handling system, comprising:

at least one processor;

memory operably coupled to the processor; and a module operably associated with the memory and the at least one processor, the module operable to derive an input signal from a sampled output signal and lossyness characteristics of a communication channel and determine a timing offset between the derived input and the sampled output signal, the timing offset representing an intersymbol interference jitter effect contribution to a communication channel timing skew budget.

16. The information handling system of claim 15, further comprising the module operable to:

calculate a communication channel propagation delay under substantially lossless conditions; and determine the timing offset by subtracting from the sampled output signal the derived input signal calculated in accordance with the substantially lossless communication channel propagation delay.

17. The information handling system of claim 16, further comprising the module operable to calculate the substantially lossless communication channel propagation delay using electrical characteristics of the communication channel obtained from a registry.

18. The information handling system of claim 15, further comprising the module implemented as a serializer/deserializer.

19. The information handling system of claim 15, further comprising the module operable to characterize communication channel lossyness by applying a DIRAC impulse input function to the communication channel and measuring communication channel response.

20. The information handling system of claim 15, further comprising the module implemented in a program of instructions operable to simulate at least one aspect of information handling system design.

21. The information handling system of claim 15, further comprising the module operable to characterize the lossyness characteristics and a substantially lossless propagation delay of a communication channel at power-up of the module.

* * * * *